United States Patent [19]

Suzuki

[11] Patent Number: 5,706,295
[45] Date of Patent: Jan. 6, 1998

[54] METHOD OF CHECKING DESIGN RULES FOR SEMICONDUCTOR INTEGRATED CIRCUIT

[75] Inventor: Kyo Suzuki, Kanagawa, Japan

[73] Assignee: NEC Corporation, Tokyo, Japan

[21] Appl. No.: 686,815

[22] Filed: Jul. 26, 1996

[30] Foreign Application Priority Data

Jul. 28, 1995 [JP] Japan .................................. 7-193547

[51] Int. Cl.[6] .................................................... G06F 11/00
[52] U.S. Cl. ............................................. 371/22.1; 364/488
[58] Field of Search ..................... 371/22.1, 26; 364/488, 364/490, 491, 577, 578

[56] References Cited

PUBLICATIONS

H. Modarres et al., "A Formal Approach to Design–Rule Checking", *IEEE Transactions on Computer–Aided Design*, vol. CAD–6, No. 4, Jul. 1987, pp. 561–573.

B.J. Crawford et al., "Computer Verification of Large Scale Integrated Circuit Masks", 1978 IEEE, pp. 132–135.

*Primary Examiner*—Vincent P. Canney
*Attorney, Agent, or Firm*—Sughrue, Mion, Zinn, Macpeak & Seas, PLLC

[57] ABSTRACT

Design rule check errors are outputted to a working file based on data entered from a mask pattern data storage unit and data entered from a design standard file, and a false error is removed from the design rule check errors based on data entered from the mask pattern data storage unit and data entered from the working file, and outputted as a design rule check result. The false error which is removed from the design rule check errors is determined based on whether the design fuel check errors overlap the mask pattern data stored in the mask pattern data storage unit.

6 Claims, 14 Drawing Sheets

METHOD OF CHECKING DESIGN RULES FOR SEMICONDUCTOR INTEGRATED CIRCUIT

BACKGROUND OF THE INVENTION

1. Field of the Invention

The present invention relates to a method of checking design rules to decide whether mask pattern data for a semiconductor integrated circuit have been designed properly according to design standards, and more particularly to a method of checking design rules for a semiconductor integrated circuit to prevent false errors from being generated.

2. Description of the Related Art

<Examples of Design Standards>

Design standards for semiconductor integrated circuits which differ depending on the structure of mask pattern data will be described below with respect to a prescribed value for intervals between interconnection data 203 around a transistor as shown in FIG. 11 of the accompanying drawings.

FIG. 12 of the accompanying drawings illustrates how the interconnection data 203 are classified into data representing interconnections 301 of the transistor and data representing interconnections 302 other than the transistor.

In FIG. 11, diffused-layer data 201 serve as mask pattern data of the transistor, and terminal data 202 as mask pattern data of terminals of the transistor. The terminal data 202 represent connections between the diffused-layer data 201 and the interconnection data 203.

According to design standards for the interconnection data 203 around the transistor, intervals between those interconnection data 203 which overlap the terminal data 202 and extend from the diffused-layer data 201 to positions where the interconnection data 203 change their direction, i.e., intervals between the interconnections 301 of the transistor, are given a prescribed value RA 204, and intervals between the remaining interconnection data 203, i.e., intervals between the interconnections 302 other than the transistor, are given a prescribed value RB 205. The prescribed value RA 204 is smaller than the prescribed value RB 205 (the prescribed value RA 204 <the prescribed value RB 205).

<1st Conventional Method>

A first conventional method of checking design rules will be described below with reference to FIG. 1 of the accompanying drawings. The first conventional method of checking design rules is employed where design standards for semiconductor integrated circuits differ depending on the structure of mask pattern data as described above. The first conventional method of checking design rules is carried out by an arrangement shown in FIG. 1 which comprises a region data generator 1202 for generating region data to output region data to a region data storage unit 1203 based on input data from a mask pattern data storage unit 1201, a data divider 1204 for dividing and outputting data from the mask pattern data storage unit 1201 and the region data storage unit 1203 to a divided data storage unit 1205, and a design rule checker 1207 for outputting a design rule check result to a design rule check result unit 1210 based on data from the divided data storage unit 1205 and data from a design standard file 1206 which stores design rules for setting the intervals between the interconnections 301 of the transistor to the prescribed value RA 204, and design rules for setting the intervals between the interconnections 302 other than the transistor to the prescribed value RB 205.

FIG. 2 of the accompanying drawings shows by way of example the mask pattern data stored in the mask pattern data storage unit 1201 shown in FIG. 1. The interval between the interconnection data 203 enclosed in an area 1301 where the interval is smaller than a prescribed value of a design value DA 1302, and smaller than a prescribed value RB 205 according to the design standards (the design value DA 1302 <the prescribed value RB 205). The intervals between the interconnection data 203 in areas other than the area 1301 are equal to the prescribed values according to the design standards (the design value RA 204, the prescribed value RB 205).

In the region data generator 1202, the diffused-layer data 201 of the transistor, which are supplied from the mask pattern data storage unit 1201, are processed according to graphic data processing so as to be expanded into transistor region data 1402 (see FIG. 3 of the accompanying drawings) by an expansion process 1401, and the transistor region data 1402 are outputted to the region data storage unit 1203.

In the data divider 1204, the interconnection data 203 supplied from the mask pattern data storage unit 1201 and the transistor region data 1402 supplied from the region data storage unit 1203 are ANDed to produce interconnection data 1501 of the transistor (see FIG. 4 of the accompanying drawings) according to graphic data processing, and the interconnection data 203 and the transistor region data 1402 are ORed to produce interconnection data 1502 other than the transistor according to graphic data processing. These interconnection data 1501, 1502 are outputted to the divided data storage unit 1205. Some of the interconnection data 1502 other than the transistor, which are positioned in a data division boundary area 1503, correspond to the interconnections 301 of the transistor according to the design standards.

In the design rule checker 1207, the interconnection data 1502 other than the transistor which are stored in the divided data storage unit 1205 are checked based on the design rules, stored in the design standard file 1206, for setting the intervals between the interconnections 302 other than the transistor to the prescribed value RB 205, as follows: As shown in FIG. 5 of the accompanying drawings, side data representing sides A1601, B1602, C1603, D1604 of the interconnections 1502 other than the transistor, the intervals between which are smaller than the prescribed value RB 205, are determined, and polygonal data representing polygonal shapes produced by interconnecting vertexes of the paired sides A1601, B1602 and the paired sides C1603, D1604 are outputted as design rule check errors to the design rule check result unit 1210.

It has been manually practiced to decide whether the outputted design rule check errors outputted to the design rule check result unit 1210 are a true error or not, by comparing the design standards and the mask pattern shown in FIG. 12. Specifically, the design rule check error composed of the sides C1603, D1604 is determined as a true error 1702 as shown in FIG. 6 of the accompanying drawings because the interval between the sides C1603, D1604 is of the design value DA 1302 and is smaller than the prescribed value RB 205 as seen from FIG. 2 and also because the sides C1603, D1604 are part of the interconnections 302 other than the transistor according to the design standards. The design rule check error composed of the sides A1601, B1602 is determined as a false error 1701 as shown in FIG. 6 because the interval between the sides A1601, B1602 is of the design value RA 204 and is smaller than the prescribed value RB 205 as seen from FIG. 2 and also because the sides A1601, B1602 are not part of the interconnections 302 other than the transistor according to the design standards but are part of the interconnections 301 of the transistor.

In the design rule checker 1207, the interconnection data 1502 of the transistor which are stored in the divided data storage unit 1205 are checked based on the design rules, stored in the design standard file 1206, for setting the intervals between the interconnections 301 of the transistor to the prescribed value RA 204, in the same manner as described above.

<2nd Conventional Method>

A second conventional method of checking design rules will be described below with reference to FIG. 7 of the accompanying drawings. The second conventional method of checking design rules, which is an improvement over the first conventional method, employs a check processing controller 1801 which is supplied with data from an input unit 1802, a mask pattern data storage unit 1803, and a design standard file 1804, receives data from and outputs data to a processed data file 1805 and a false error registration file 1807, and outputs a design rule check result to a design rule check result unit 1806 (see, for example, Japanese laid-open patent publication No. 4-36866).

The mask pattern data storage unit 1803 stores the mask pattern data shown in FIG. 2, and the design standard file 1804 stores design rules for setting the intervals between the interconnections 301 of the transistor to the prescribed value RA 204, and design rules for setting the intervals between the interconnections 302 other than the transistor to the prescribed value RB 205. The second conventional method of checking design rules is carried out as follows:

In a first design rule check cycle, the check processing controller 1801 executes the same checking process as with the first conventional method of checking design rules, and outputs design rule check errors to the processed data file 1805. Inasmuch as the false error registration file 1807 is not specified in the first design rule check cycle, the data from the processed data file 1805 are outputted directly to the design rule check result unit 1806.

Then, it is manually decided whether the design rule check error outputted to the design rule check result unit 1806 is a true error or a false error. If the design rule check error is decided as a false error, e.g., as the false error 1701 shown in FIG. 6, then it is manually registered in the false error registration file 1807 using the input unit 1807. If the design rule check error is decided as a true error, e.g., the true error 1702 shown in FIG. 6, then the mask pattern data are manually corrected with respect to the design rule check error.

In a second design rule check cycle, the mask pattern data corrected with respect to the true error in the first design rule check cycle are stored in the mask pattern data storage unit 1803. The false error registration file 1807 which has been registered in the first design rule check cycle is specified, and the check processing controller 1801 executes the same checking process as with the first conventional method of checking design rules, and outputs design rule check errors to the processed data file 1805. Inasmuch as the false error registration file 1807 is specified in the second design rule check cycle, design rule check errors which are left after the data registered in the false error registration file 1807 are removed from the processed data file 1805 are outputted to the design rule check result unit 1806. If the mask pattern data have properly been corrected with respect to the true error generated in the first design rule check cycle, then the design rule check errors which are outputted to the processed data file 1805 in the second design rule check cycle do not include a true error, but include a false error which is the same as the false error that has been registered in the false error registration file 1807 in the first design rule check cycle. Therefore, the second design rule check cycle produces a design rule check result free of any false error which has been generated in the first design rule check cycle.

According to the first conventional method of checking design rules, since a manual process is needed to decide whether a design rule check error is a true error or a false error, it is time-consuming and tends to cause a human error to decide whether a design rule check error is a true error or a false error.

According to the second conventional method of checking design rules, a false error generated in a first design rule check cycle is registered, and removed in a second design rule check cycle. Therefore, it is impossible to prevent a false error from being produced in the first design rule check cycle, and at least two design check cycles need to be carried out to remove a false error. In addition, a true error is corrected in the first design rule check cycle, and, as shown in FIG. 8 of the accompanying drawings, interconnection data 203 which have suffered a false error in the first design rule check cycle are corrected at 1902, producing interconnection data 1901 which are stored as mask pattern data in the mask pattern data storage unit 1803 for the second design rule check cycle. A false error generated in the first design rule check cycle, e.g., the false error 1701 shown in FIG. 6, and a design rule check error generated in the second design rule check cycle, e.g., a false error 2001 shown in FIG. 9, do not agree with each other. Therefore, the false error registered in the false error registration file 1807 is not removed from the design rule check errors outputted to the processed data file 1805 in the second design rule check process, and is outputted as the false error 2001 to the design rule check result unit 1806. Consequently, the second conventional method fails to prevent a false error from being generated. Furthermore, since it is manually decided whether a design rule check error is a true error or a false error, it is time-consuming and tends to cause a human error to decide whether a design rule check error is a true error or a false error, as with the first conventional method.

SUMMARY OF THE INVENTION

It is an object of the present invention to provide a method of checking design rules for a semiconductor integrated circuit, which will eliminate the drawbacks of the first and second conventional methods of checking design rules.

According to a first aspect of the present invention, there is provided a method of checking design rules for a semiconductor integrated circuit to determine whether or not mask pattern data of the semiconductor integrated circuit, which represent active and passive components on a surface of a semiconductor substrate, are properly designed according to design standards for the semiconductor integrated circuit, the method comprising the step of deciding whether design rule check error data which are generated are indicative of a true error or a false error, depending on whether or not the design rule check error data are present in a corresponding region of the mask pattern data on the semiconductor substrate.

The method according to the first aspect of the present invention may further comprise the steps of entering the mask pattern data, entering the design rule check error data, determining the design rule check error data as representing the true error if the design rule check error data are not present in the corresponding region of the mask pattern data on the semiconductor substrate, and as representing the false error if the design rule check error data are present in the corresponding region of the mask pattern data on the semiconductor substrate, outputting the true error as a design rule check result, and failing to output the false error as a design rule check result.

Alternatively, the method according to the first aspect of the present invention may further comprise the steps of entering the mask pattern data, entering the design rule check error data, determining the design rule check error data as representing the true error if the design rule check error data are present in the corresponding region of the mask pattern data on the semiconductor substrate, and as representing the false error if the design rule check error data are not present in the corresponding region of the mask pattern data on the semiconductor substrate, outputting the true error as a design rule check result, and failing to output the false error as a design rule check result.

According to a second aspect of the present invention, there is provided a method of checking design rules for a semiconductor integrated circuit to determine whether or not mask pattern data of the semiconductor integrated circuit, which represent active and passive components on a surface of a semiconductor substrate, are properly designed according to design standards for the semiconductor integrated circuit, the method comprising the step of deciding whether design rule check error data which are generated are indicative of a true error or a false error, depending on whether or not the design rule check error data are present in a specified region on the semiconductor substrate.

The method according to the second aspect of the present invention may further comprise the steps of entering the mask pattern data, entering the design rule check error data, determining the design rule check error data as representing a temporary error if the design rule check error data are not present in a corresponding region of the mask pattern data on the semiconductor substrate, and as representing the false error if the design rule check error data are present in the corresponding region of the mask pattern data on the semiconductor substrate, determining the design rule check error data as representing the true error if the temporary error is present in the specified region, and as representing the false error if the temporary error is not present in the specified region, outputting the true error as a design rule check result, and failing to output the false error as a design rule check result.

Alternatively, the method according to the second aspect of the present invention may further comprise the steps of entering the mask pattern data, entering the design rule check error data, determining the design rule check error data as representing a temporary error if the design rule check error data is present in a corresponding region of the mask pattern data on the semiconductor substrate, and as representing the false error if the design rule check error data are not present in the corresponding region of the mask pattern data on the semiconductor substrate, determining the design rule check error data as representing the true error if the temporary error is present in the specified region, and as representing the false error if the temporary error is not present in the specified region, outputting the true error as a design rule check result, and failing to output the false error as a design rule check result.

The above and other objects, features, and advantages of the present invention will become apparent from the following description with reference to the accompanying drawings which illustrate examples of the present invention.

DETAILED DESCRIPTION OF THE PREFERRED EMBODIMENTS

<1st Embodiment>

Figure 1:
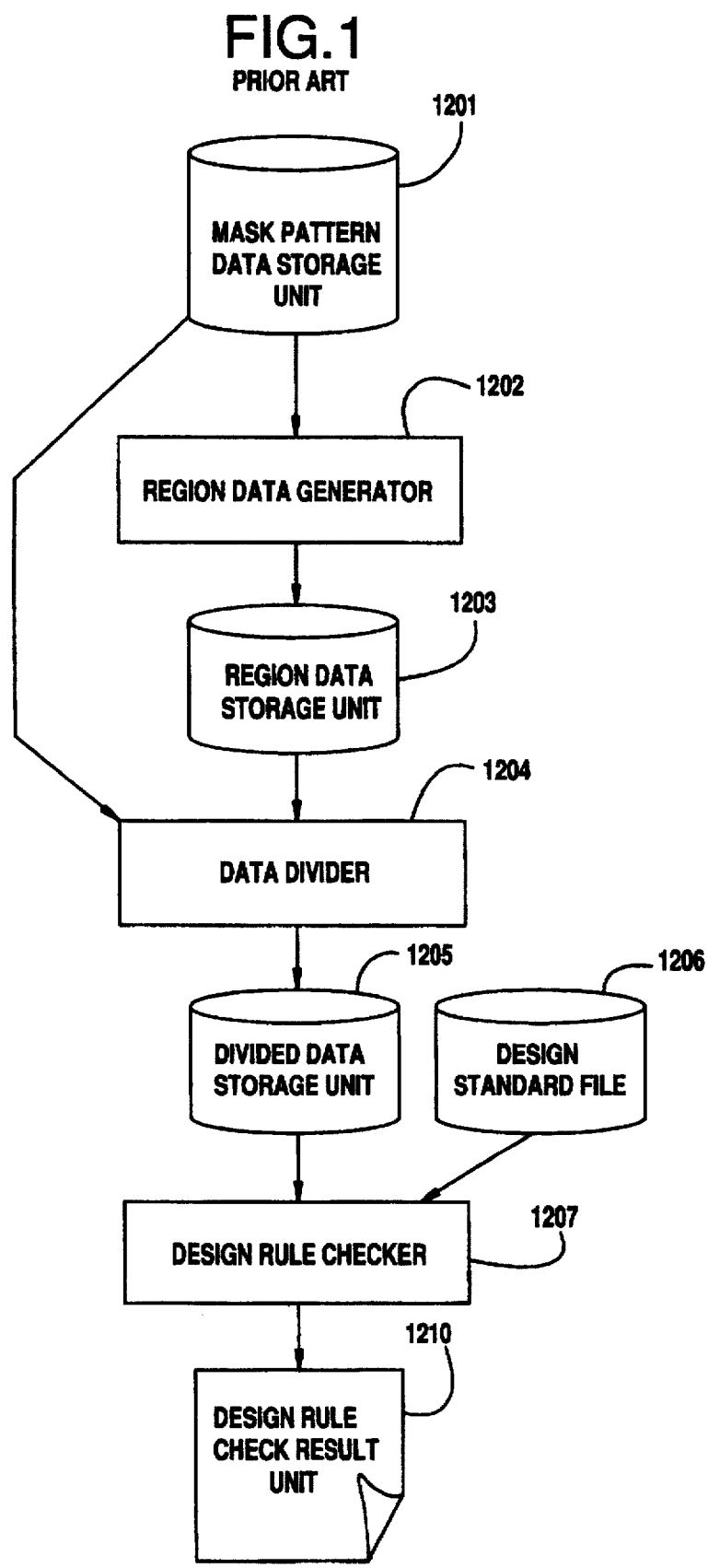
FIG. 1 is a block diagram of an arrangement for carrying out a first conventional method of checking design rules.
Figure 2:
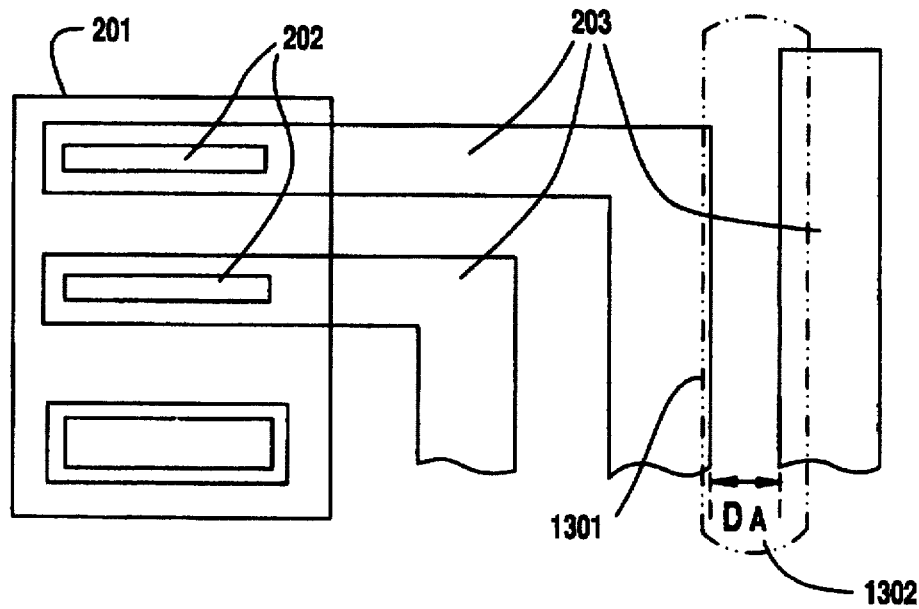
FIG. 2 is a fragmentary view showing mask pattern data to be checked for design rules according to the present invention and the first conventional method.
Figure 3:
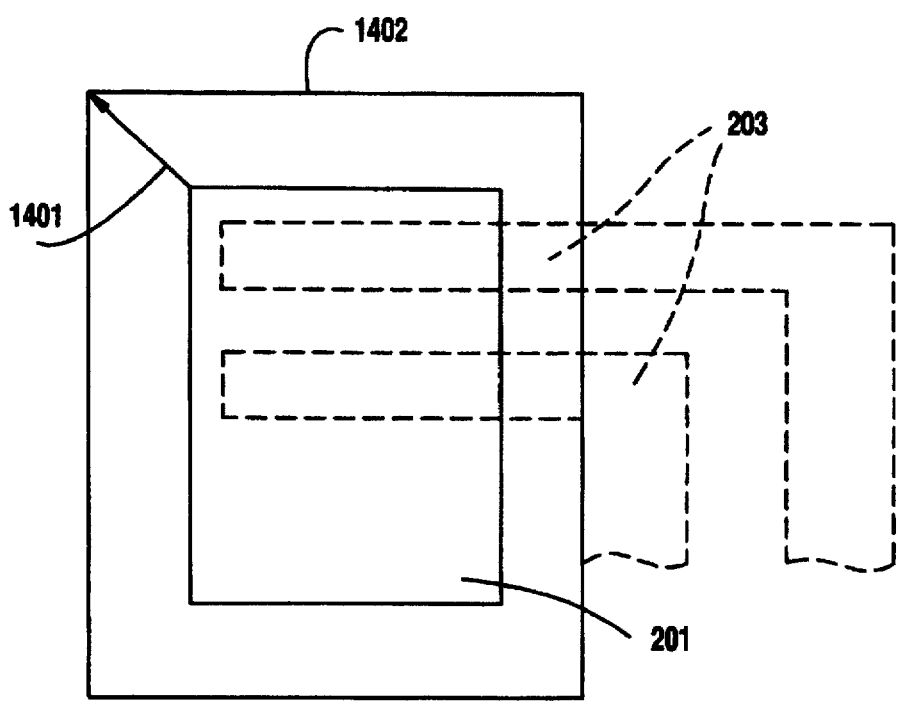
FIG. 3 is a fragmentary view showing a process of generating region data in the first conventional method.
Figure 4:
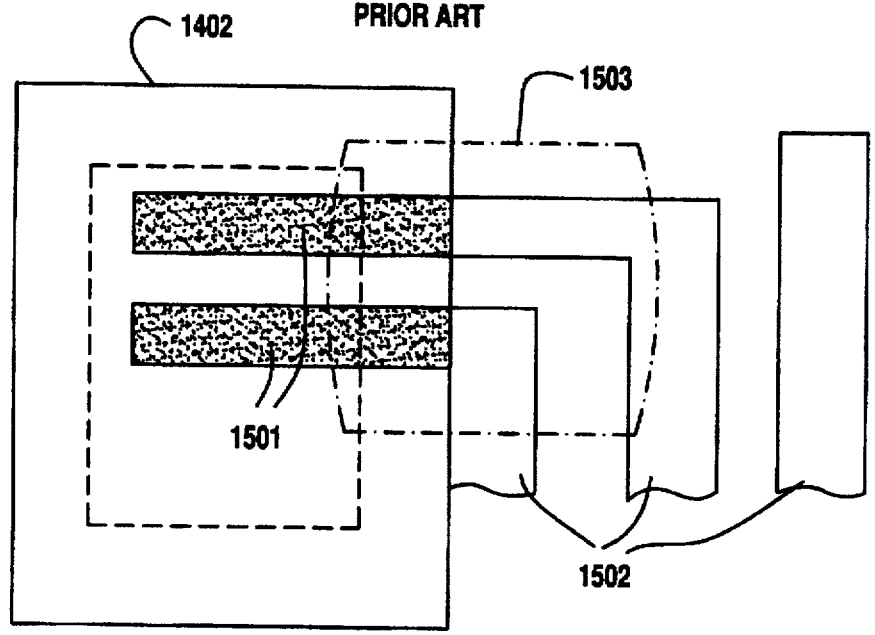
FIG. 4 is a fragmentary view showing a process of dividing data in the first conventional method.
Figure 5:
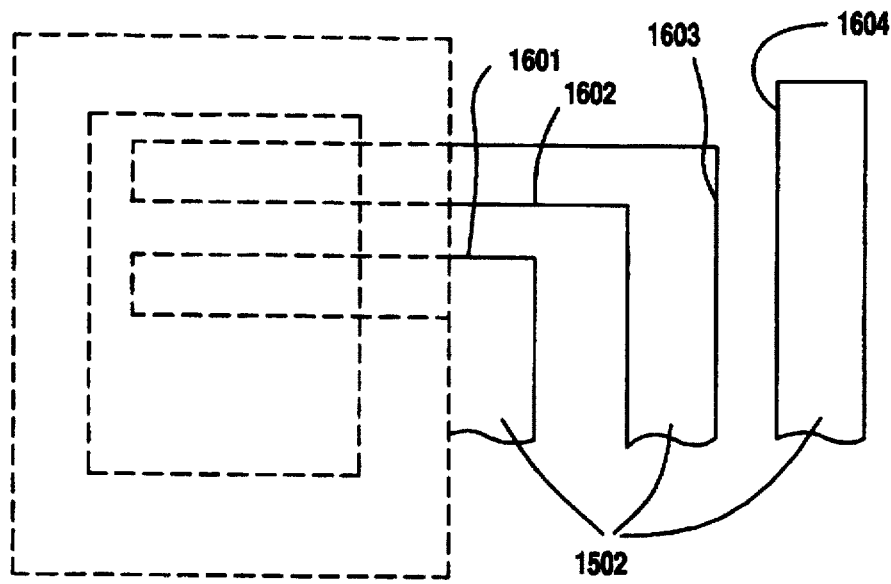
FIG. 5 is a fragmentary view showing a process of checking design rules according to the present invention and the first conventional method.
Figure 6:
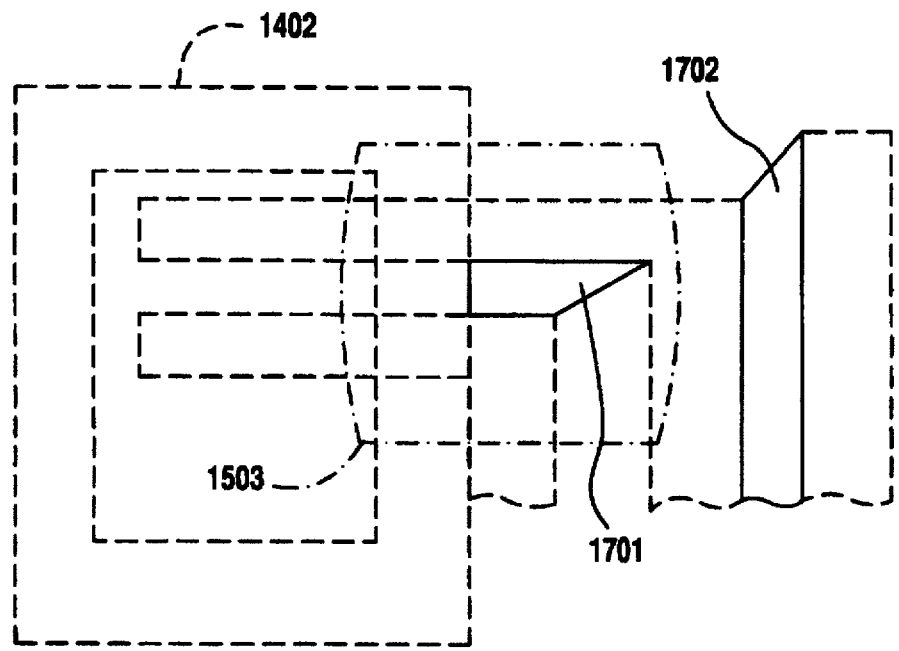
FIG. 6 is a fragmentary view showing design check errors including true and false errors according to the first conventional method.
Figure 11:
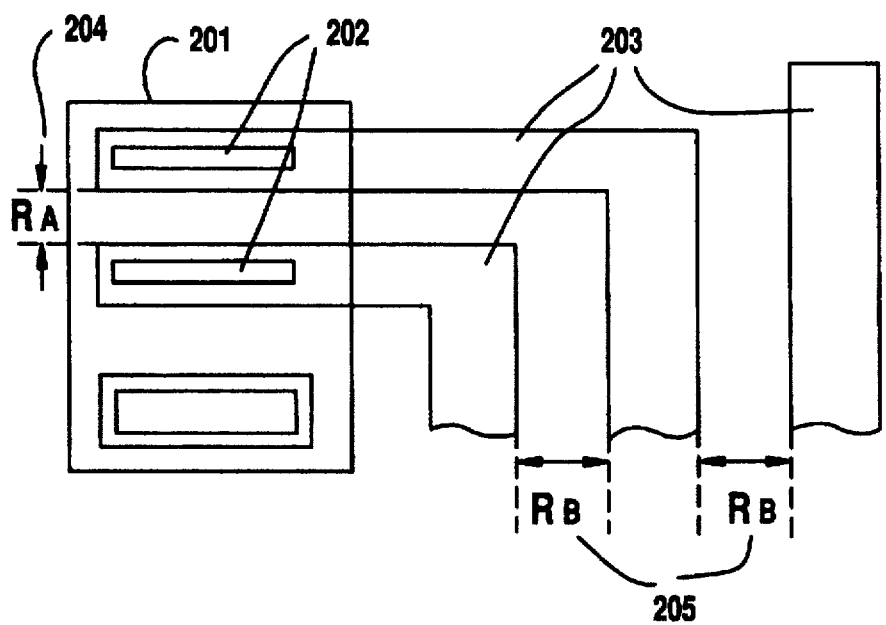
FIG. 11 is a fragmentary view showing prescribed values for intervals between interconnection data around a transistor according to design standards in the present invention and conventional methods.
Figure 7:
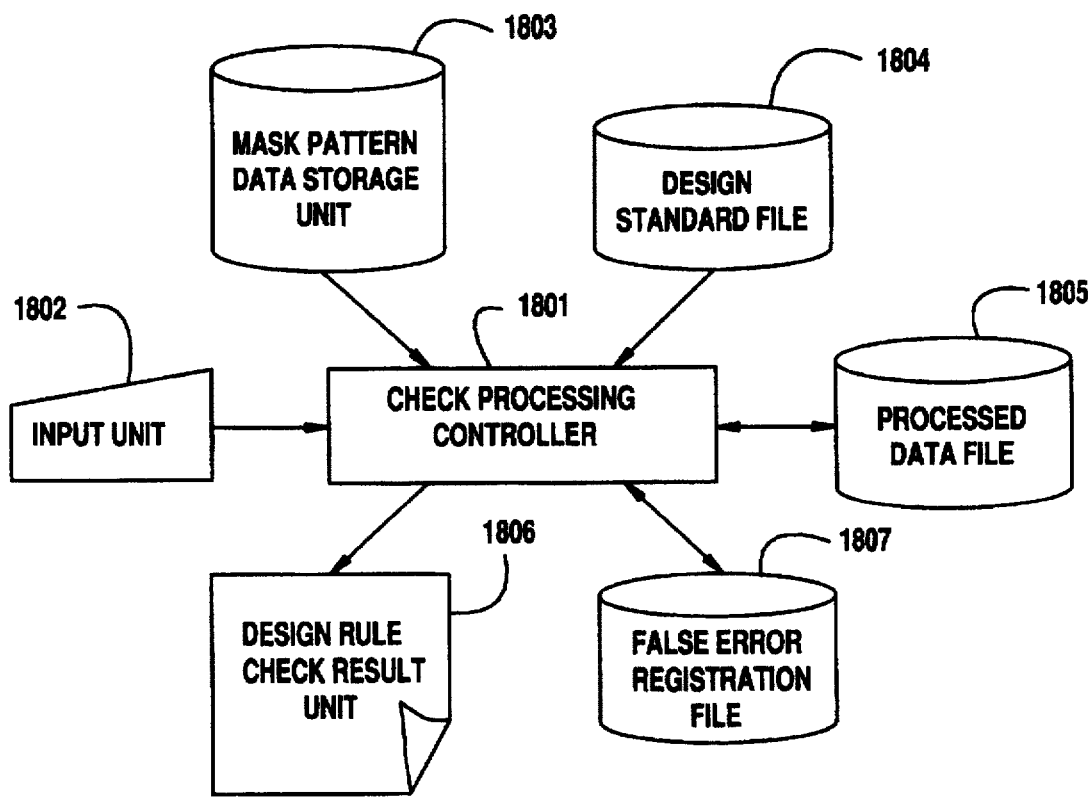
FIG. 7 is a block diagram of an arrangement for carrying out a second conventional method of checking design rules.
Figure 8:
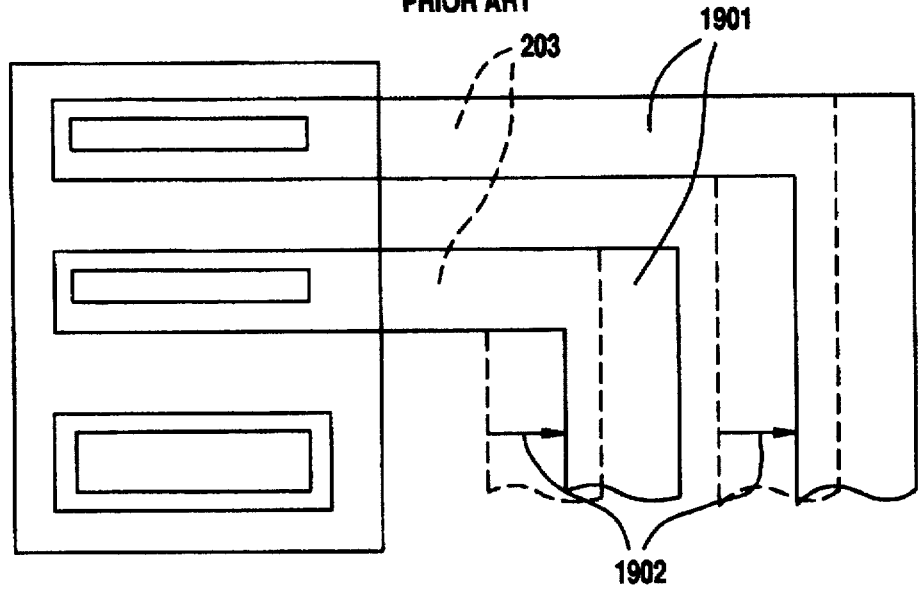
FIG. 8 is a fragmentary view showing mask pattern data with interconnected data corrected according to the second conventional method.
Figure 9:
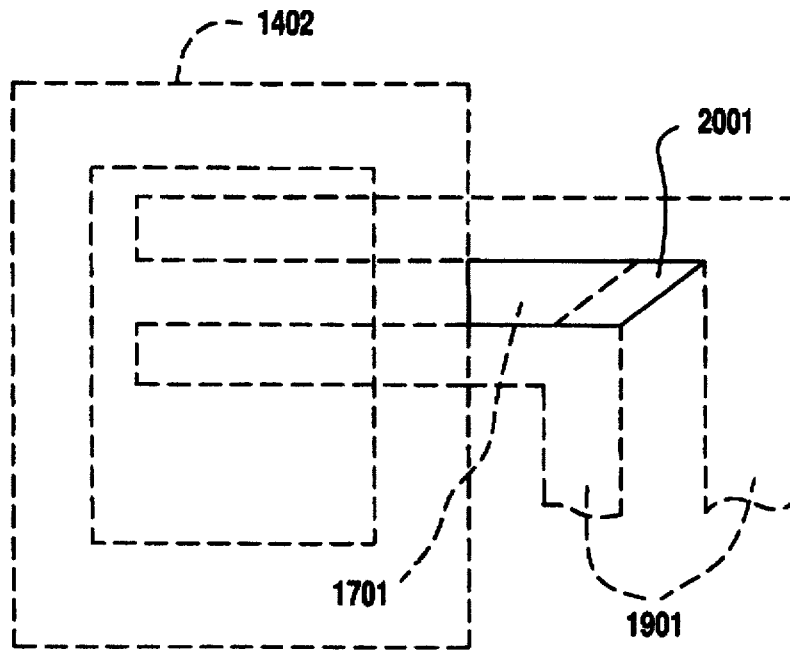
FIG. 9 is a fragmentary view showing design check errors including false errors according to the second conventional method.
Figure 10:
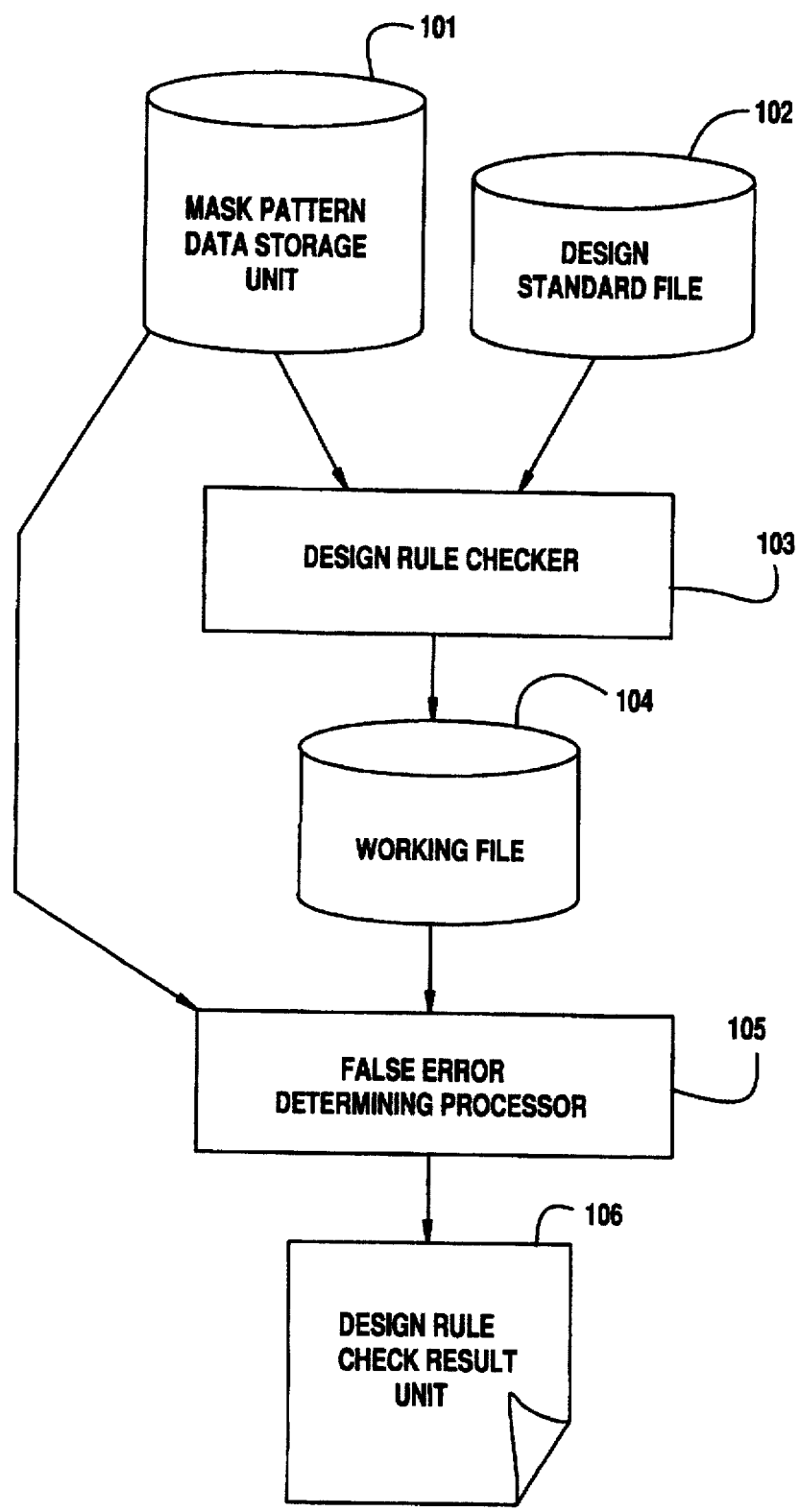
FIG. 10 is a block diagram of an arrangement for carrying out a method of checking design rules according to a first embodiment of the present invention.
Figure 12:
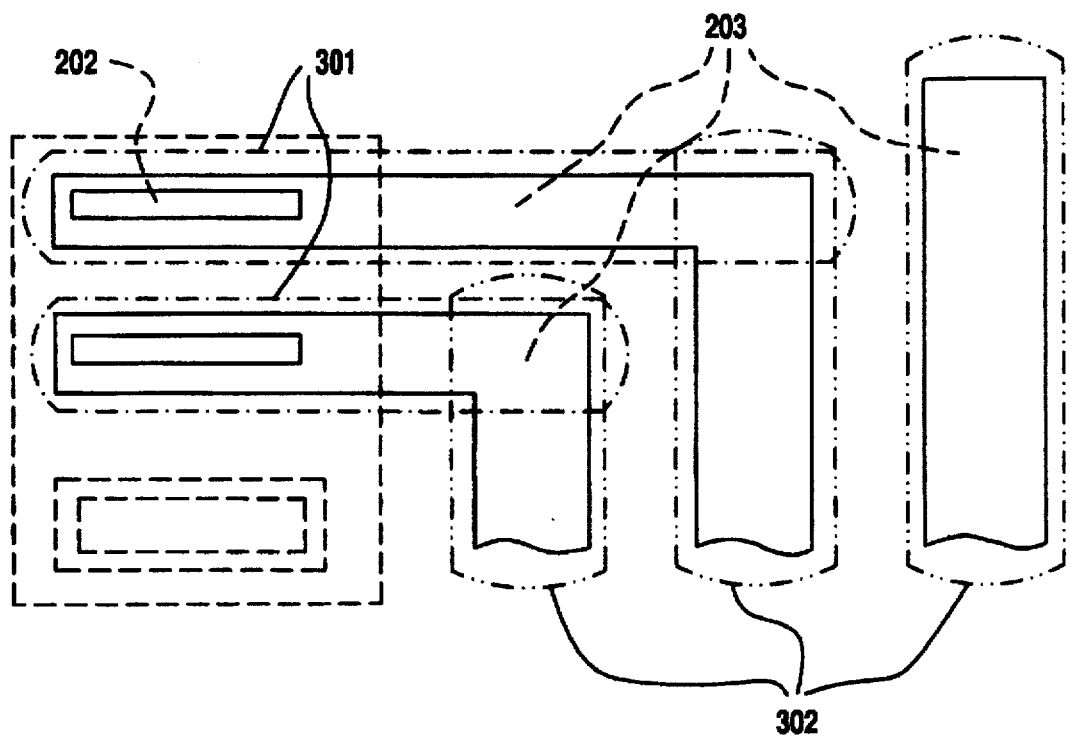
FIG. 12 is a fragmentary view showing interconnection data that are classified into data representing interconnections of the transistor and data representing interconnections other than the transistor depending on the structure of mask pattern data, according to design standards in the present invention and conventional methods.

FIG. 10 shows in block form an arrangement for carrying out a method of checking design rules according to a first embodiment of the present invention. As shown in FIG. 10, a mask pattern data storage unit 101 stores mask pattern data as shown in FIG. 2 as with the first and second conventional methods. A design standard file 102 stores design rules for setting the intervals between the interconnections 302 other than the transistor according to the design standards, for which a false error has been produced in the first and second conventional methods, to the prescribed value RB 205. Operation of the arrangement shown in FIG. 10 with respect to the method of checking design rules according to the first embodiment of the present invention will be described below.

Figure 13:
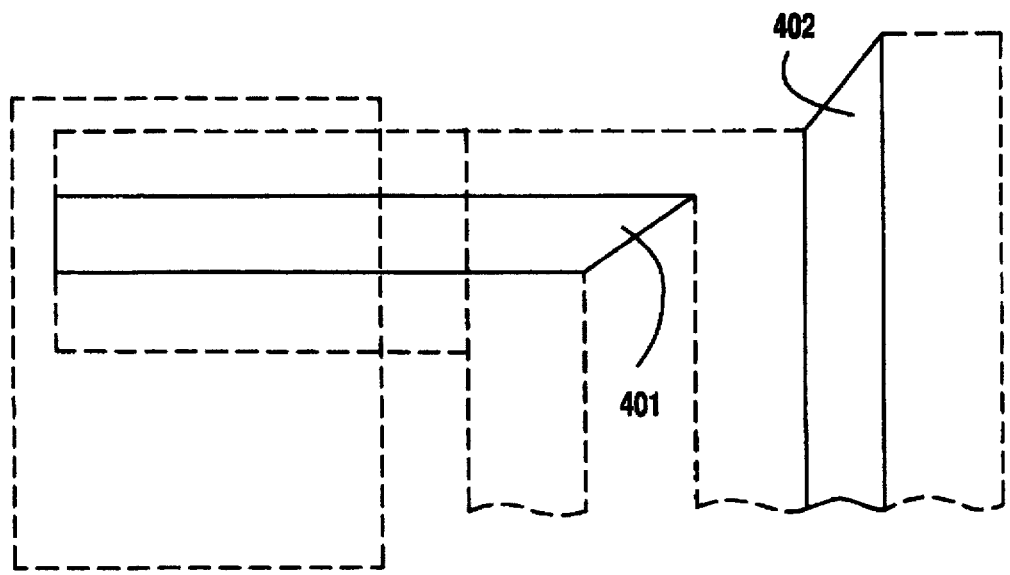
FIG. 13 is a fragmentary view showing design check errors outputted in a process of checking design rules according to the first embodiment of the present invention.

First, a design rule checker 103 effects the same process as the design rule checker 1207, described above with respect to the first conventional method, on interconnection data 203, to determine areas where the interval between the interconnection data 203 is less than the prescribed value RB 205, as design rule check errors, i.e., errors A 401, B 402 shown in FIG. 13, and outputs the design rule check errors to a working file 104.

Figure 15:
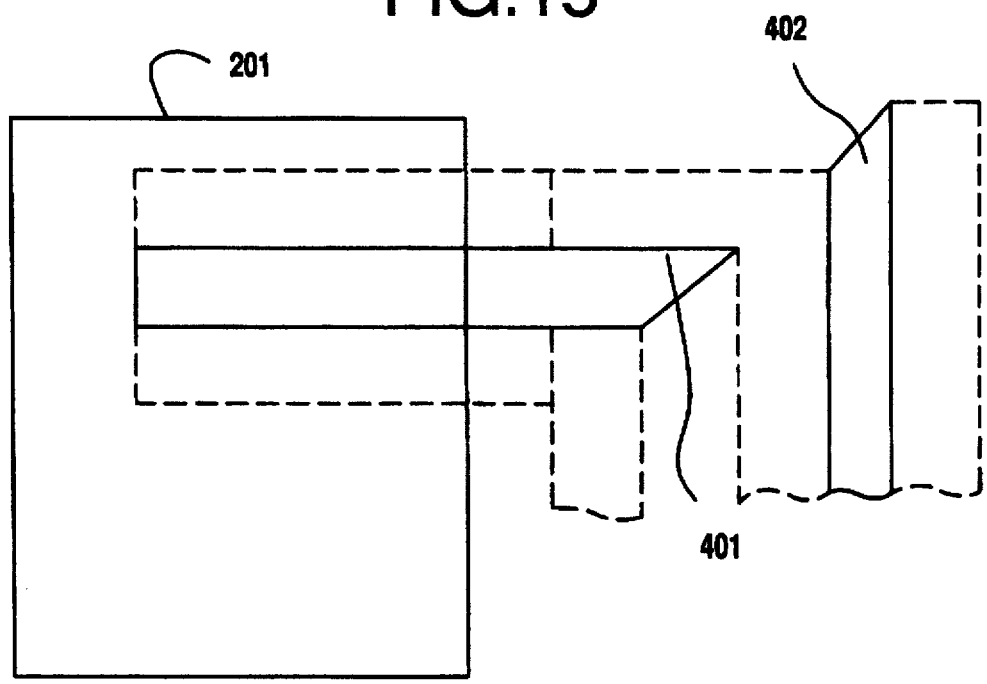
FIG. 15 is a fragmentary view illustrative of the process of determining a false error according to the first embodiment of the present invention.
Figure 14:
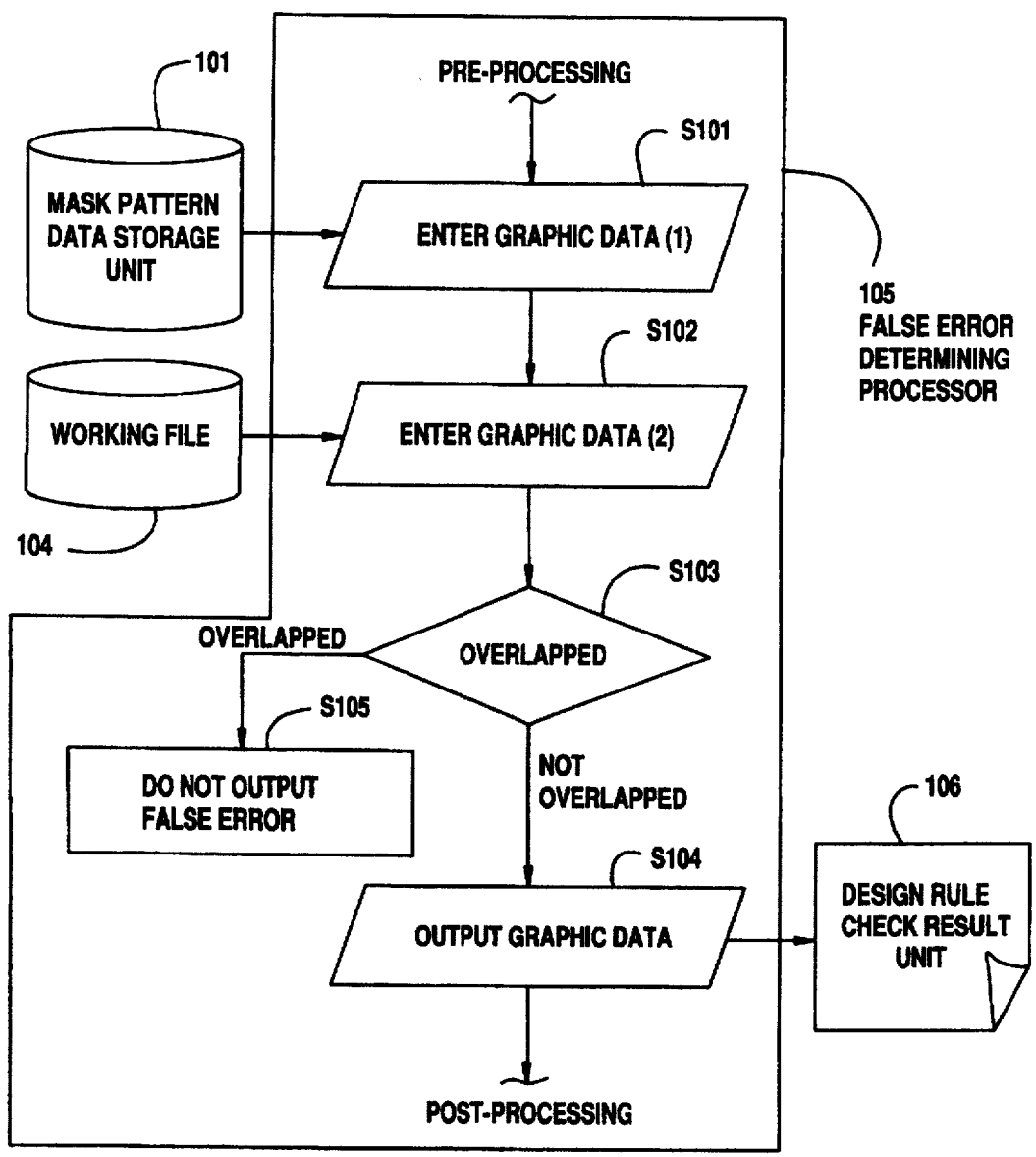
FIG. 14 is a flowchart of a process of determining a false error according to the first embodiment of the present invention.

A process of determining a false error which is carried out by a false error determining processor 105 will be described below. FIG. 14 is a flowchart of the process of determining a false error which is carried out by the false error determining processor 105, and FIG. 15 is illustrative of the process of determining a false error.

Following a pre-processing procedure, diffused-layer data 201 of a transistor are entered from the mask pattern data storage unit 101 in a step S101, and design rule check errors (errors A 401, B 402) are entered from the working file 104 in a step S102.

In a next step S103, it is determined whether the diffused-layer data 201 and the design rule check errors overlap each other or not. The error B 402, shown in FIG. 15, which does not overlap the diffused-layer data 201 is regarded as a true error, and is outputted to a design rule check result unit 106 in a step S104. The error A 401, shown in FIG. 15, which overlaps the diffused-layer data 201 is regarded as a false error, and is not outputted to the design rule check result unit 106 in a step S105. The error B 402 is a true error because it is produced in the interconnections 302 other than the transistor according to the design standards, and the error A 401 is a false error because it is produced in the interconnections 301 of the transistor according to the design standards.

In the case where design rules for setting the intervals between the interconnections 301 of the transistor according to the design standards to the prescribed value RA 204 are stored in the design standard file 102, the same process as described above is carried out to obtain the same advantages as described above. However, as shown in FIG. 16, a step S203 decides whether the diffused-layer data 201 and the design rule check errors overlap each other or not, and the error which does not overlap the diffused-layer data 201 is regarded as a false error, and the error which overlaps the diffused-layer data 201 is regarded as a true error.

Figure 16:
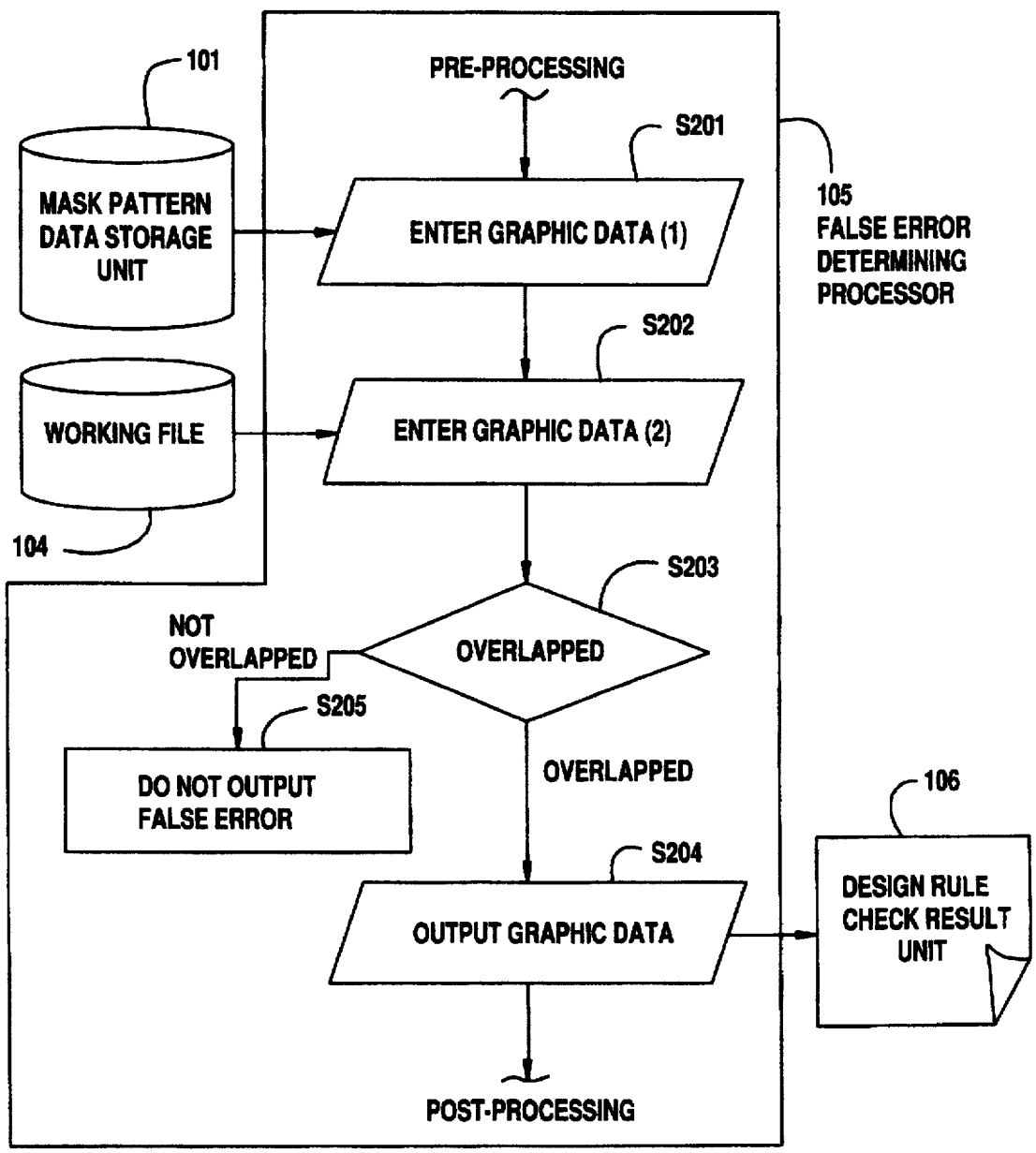
FIG. 16 is a flowchart of another process of determining a false error according to the first embodiment of the present invention.

The processing in steps S201, S202, S204, S205 shown in FIG. 16 is identical to the processing in the steps S101, S102, S104, S105, respectively, shown in FIG. 14.

<Exception to the Design Standards>

Figure 17:
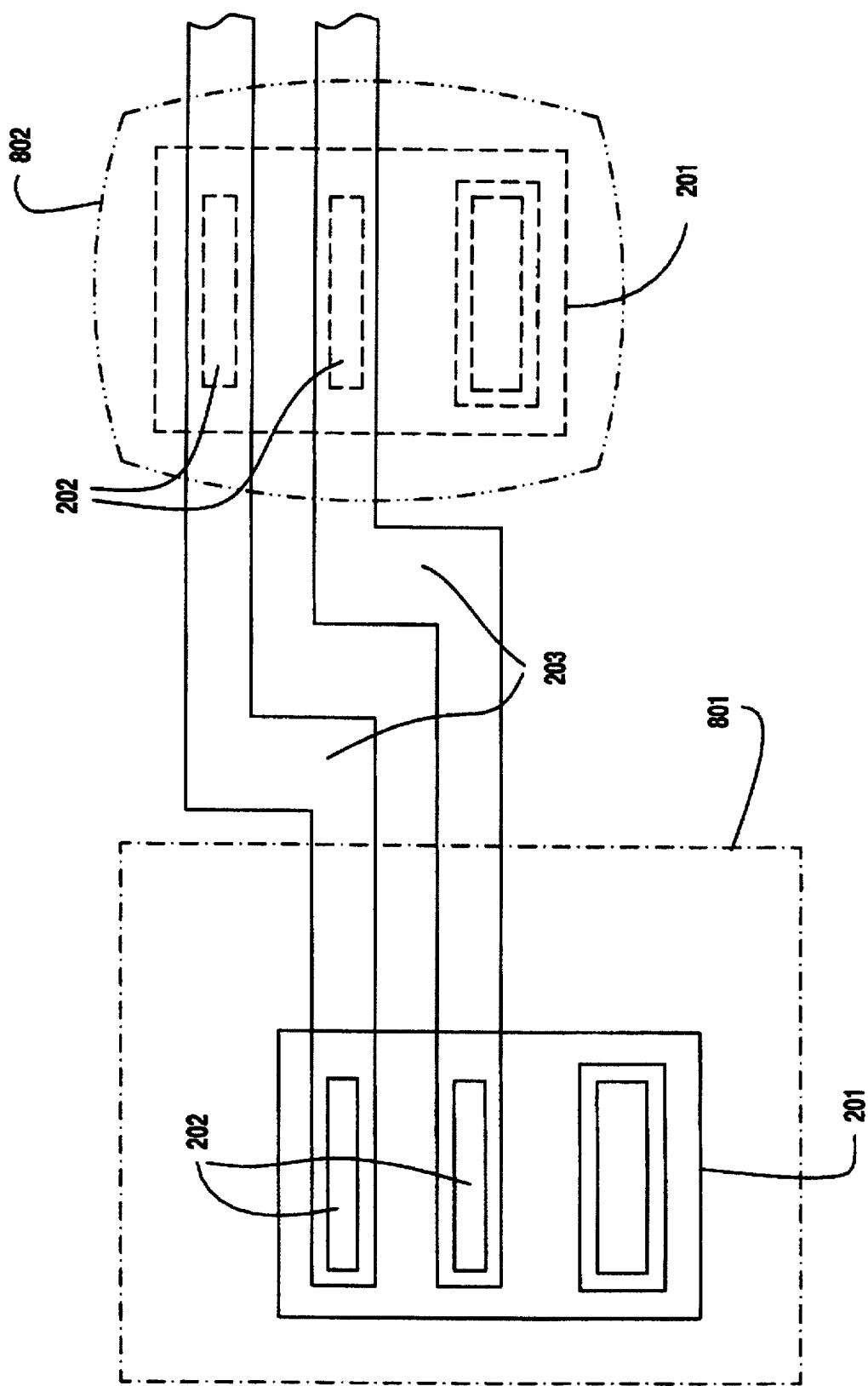
FIG. 17 is a fragmentary view showing mask pattern data with a region specified for checking design rules with respect to an exception to design rules.

An exception to design rules will be described below with reference to FIG. 17. FIG. 17 shows mask pattern data with a region specified for checking design rules, which will be referred to as "region-specified mask pattern data". Diffused-layer data 201 serve as mask pattern data of a transistor, and terminal data 202 as mask pattern data of terminals of the transistor. The terminal data 202 represent connections between the diffused-layer data 201 and interconnection data 203. The interconnection data 203 are generated according to design standards. Specified-region data 801 represent a region frame for checking design rules. The region-specified mask pattern data include only mask pattern data within the specified-region data 801 and mask pattern data across the specified-region data 801. For example, the diffused-layer data 201 and the terminal data 202 within the specified-region data 801 and the interconnections 203 extending across the specified-region data 801 are included in the region-specified mask pattern data, and the diffused-layer data 201 and the terminal data 202 which are positioned outside of the specified-region data 801, i.e., mask pattern data of a transistor indicated by the broken lines and contained in outside-region data 802 are not included in the region-specified mask pattern data. The mask pattern data outside of the specified-region data 801 are an exception to the design standards, and will not be checked for design rules.

If design rules are checked using the mask pattern data which are an exception to the design standards in the same manner as with the first embodiment, then a false error will be produced as described below.

Figure 18:
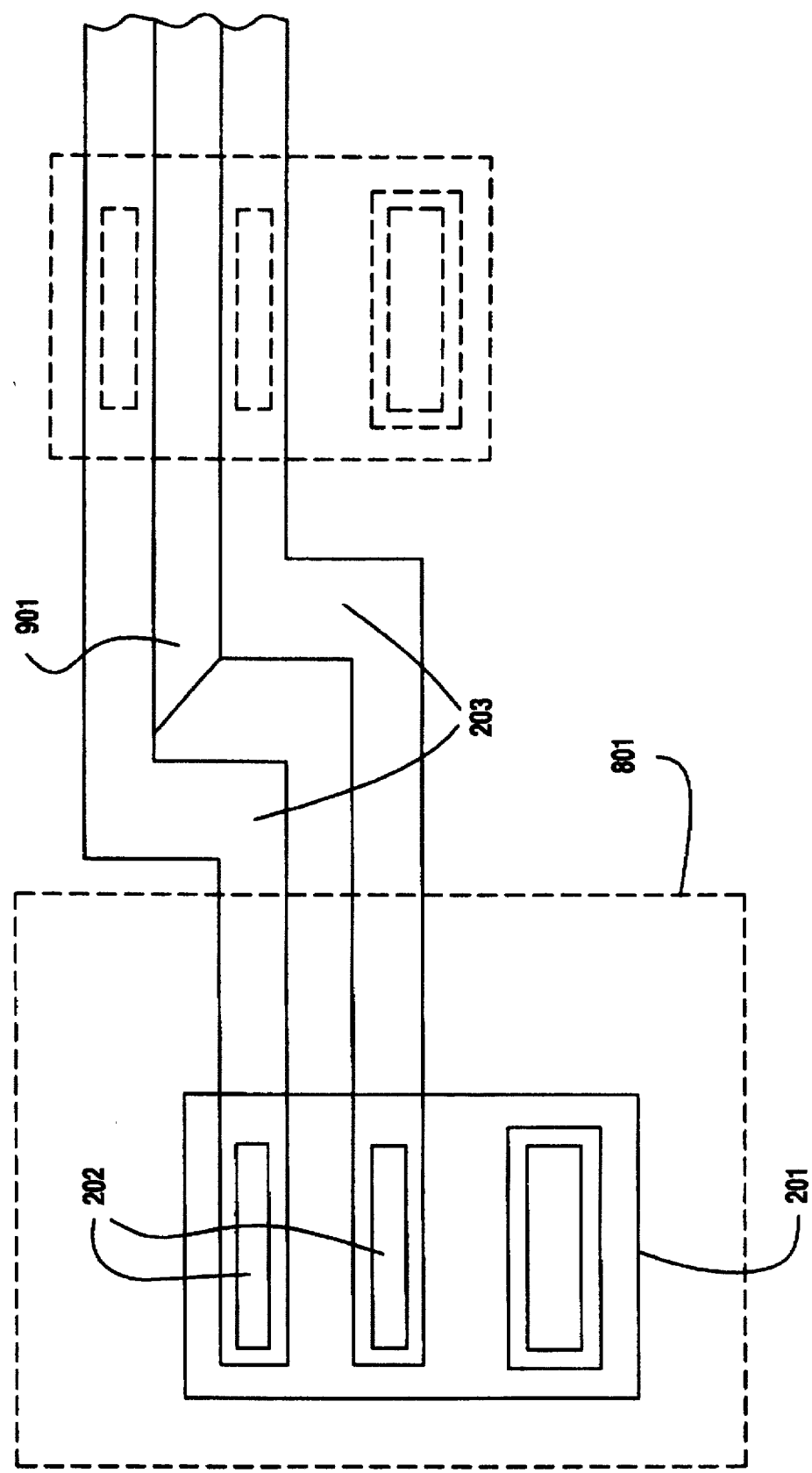
FIG. 18 is a fragmentary view showing mask pattern data used in the present invention.

The interconnection data 203 across the specified-region data 801, positioned on the mask pattern data of the transistor that is not included in the region-specified mask pattern data, as shown in FIG. 18, cause a design rule check error C 901 to be produced because the interconnection data 203 violate the design standards that the intervals between the interconnections 302 other than the transistor are of the prescribed value RB 205. Since the interconnection data 203 across the specified-region data 801 are positioned outside of the specified-region data 801, the interconnection data 203 are an exception to the design standards, and the error C 901 shown in FIG. 18 is a false error.

<2nd Embodiment>

Figure 19:
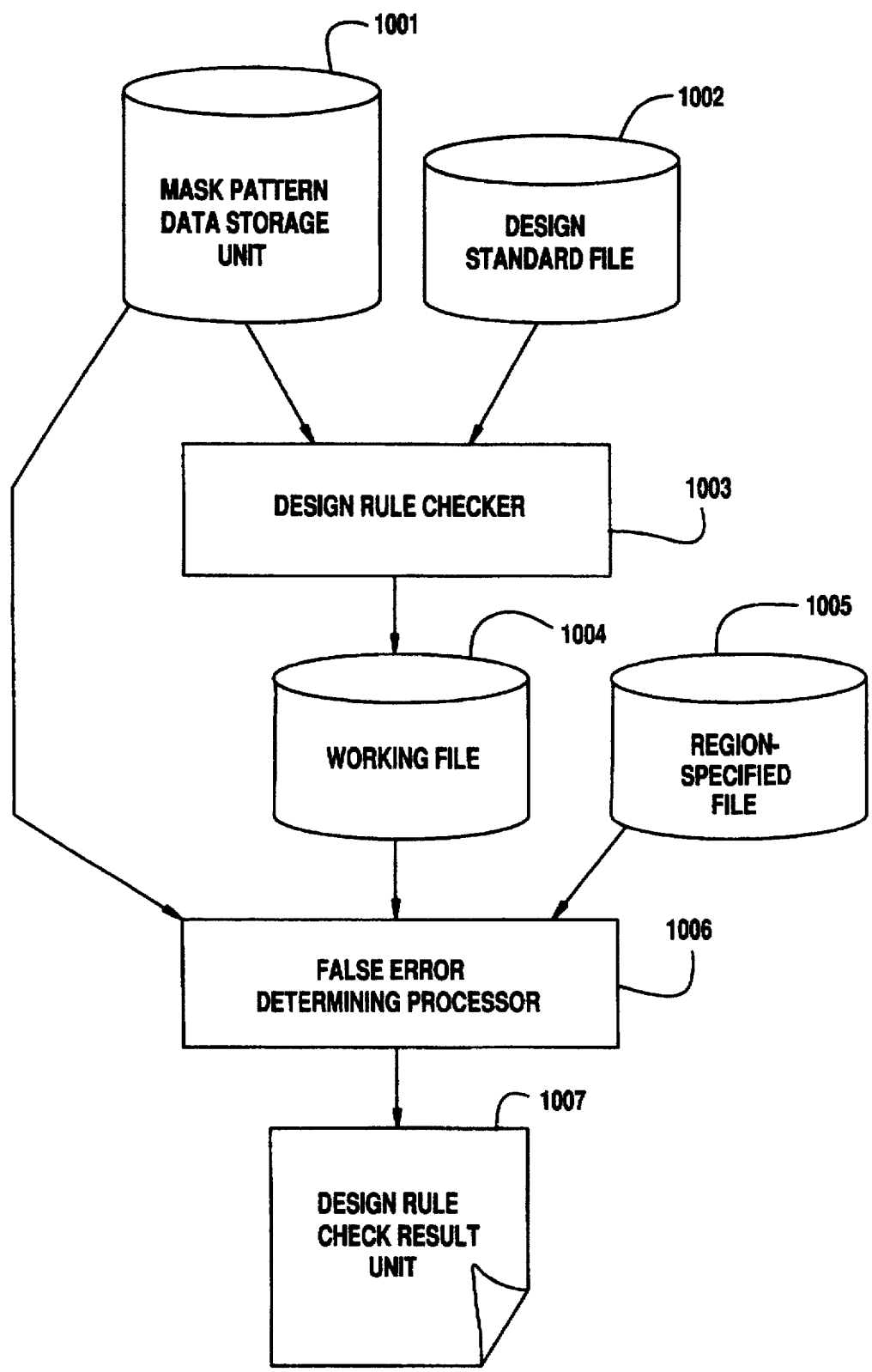
FIG. 19 is a block diagram of an arrangement for carrying out a method of checking design rules according to a second embodiment of the present invention.

FIG. 19 shows in block form an arrangement for carrying out a method of checking design rules according to a second embodiment of the present invention. As shown in FIG. 19, a mask pattern data storage unit 1001 stores the region-specified mask pattern data described above. A region-specified file 1005 stores the specified-region data 801. A design standard file 1002 stores design rules for setting the intervals between the interconnections 302 other than the transistor according to the design standards, for which a false error has been produced in the first and second conventional methods, to the prescribed value RB 205. Operation of the arrangement shown in FIG. 19 with respect to the method of checking design rules according to the second embodiment of the present invention will be described below.

First, a design rule checker 1003 effects the same process as the design rule checker 103 according to the first embodiment, on interconnection data 203, and outputs design rule check errors to a working file 1004.

Figure 20:
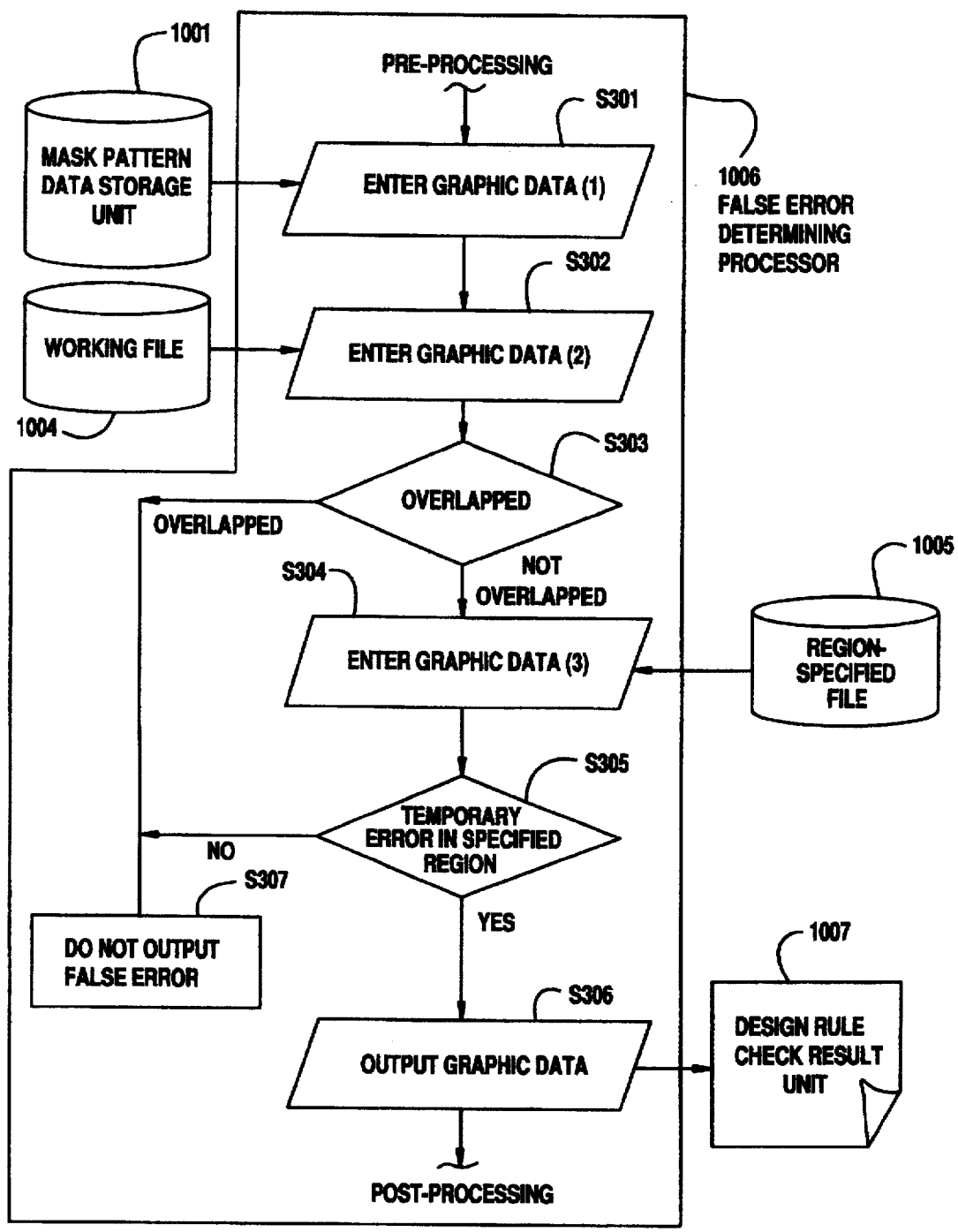
FIG. 20 is a flowchart of a process of determining a false error according to the second embodiment of the present invention.

A process of determining a false error which is carried out by a false error determining processor 1006 will be described below. FIG. 20 is a flowchart of the process of determining a false error which is carried out by the false error determining processor 1006.

The false error determining processor 1006 carries out steps S301 through S303 shown in FIG. 20, which are the same as the steps S101 through S103 shown in FIG. 14 that are carried out by the false error determining processor 105 according to the first embodiment, to determine a design rule check error (hereinafter referred to as a "temporary error") which does not overlap the diffused-layer data 201. The error C 901, for example, shown in FIG. 18 is a temporary error.

In a step S304, the specified-region data 801 shown in FIG. 17 are supplied from the region-specified file 1005. In a step S305, it is determined whether the temporary error falls in a specified region or not by deciding whether the temporary error overlaps the specified-region data 801 or not. The temporary error which overlaps the specified-region data 801 is regarded as a true error, and is outputted to a design rule check result unit 1007 in a step S306. The temporary error which does not overlap the specified-region data 801 is regarded as a false error because it is an exception to the design standards, and is not outputted to the design rule check result unit 1007 in a step S307. The error C 901 shown in FIG. 18 is regarded as a false error and is not outputted to the design rule check result unit 1007 because it does not overlap the specified-region data 801.

In the case where design rules for setting the intervals between the interconnections 301 of the transistor according to the design standards to the prescribed value RA 204 are stored in the design standard file 1002, the same process as described above is carried out to obtain the same advantages as described above except that the temporary error which does not overlap the specified-region data 801 is regarded as a true error, and the temporary error which overlaps the specified-region data 801 is regarded as a false error.

The method according to the second embodiment is free of the limitation that a false error is generated according to the first embodiment.

The above embodiments have been described with respect to the checking of design rules for the intervals between interconnection data. However, the principles of the present invention are applicable to the checking of design rules for the width of interconnection data and also for other mask pattern data.

The above decision steps S103, S203, S303 decide whether a design rule check error overlaps the diffused-layer data 201. However, if different design standards are employed depending on the structure of mask pattern data other than the diffused-layer data 201, then the above decision steps may decide whether a design rule check error overlaps mask pattern data other than the diffused-layer data 201.

According to the present invention, as described above, the false error determining processor uses mask pattern data and design rule check errors, or mask pattern data, design rule check errors, and specified-region data, and removes a false error from the design rule check errors and outputs the false error to the design rule check result unit. It is thus possible to prevent a false error from being generated through the execution of one design rule check cycle. Since a false error is prevented from being generated, no period of time is consumed for manually deciding whether a design rule check error is a true error or a false error. Furthermore, no human error is caused to occur because any manual process of deciding whether a design rule check error is a true error or a false error is not required.

While preferred embodiments of the present invention have been described using specific terms, such description is for illustrative purposes only, and it is to be understood that changes and variations may be made without departing from the spirit or scope of the following claims.

What is claimed is:

1. A method of checking design rules for a semiconductor integrated circuit to determine whether or not mask pattern data of the semiconductor integrated circuit, which represent active and passive components on a surface of a semiconductor substrate, are properly designed according to design standards for the semiconductor integrated circuit, said method comprising the step of:

deciding whether design rule check error data indicate a true error or a false error based on whether or not the design rule check error data are present in a region of said semiconductor substrate corresponding to a specific region of said mask pattern data.

2. A method of checking design rules for a semiconductor integrated circuit to determine whether or not mask pattern data of the semiconductor integrated circuit, which represent active and passive components on a surface of a semiconductor substrate, are properly designed according to design standards for the semiconductor integrated circuit, said method comprising the steps of:

deciding whether design rule check error data which are generated are indicative of a true error or a false error, depending on whether or not the design rule check error data are present in a corresponding region of said mask pattern data on said semiconductor substrate;

entering said mask pattern data;

entering said design rule check error data;

determining said design rule check error data as representing said true error if said design rule check error data are not present in the corresponding region of said mask pattern data on said semiconductor substrate, and as representing said false error if said design rule check error data are present in the corresponding region of said mask pattern data on said semiconductor substrate;

outputting said true error as a design rule check result; and failing to output said false error as a design rule check result.

3. A method of checking design rules for a semiconductor integrated circuit to determine whether or not mask pattern data of the semiconductor integrated circuit, which represent active and passive components on a surface of a semiconductor substrate, are properly designed according to design standards for the semiconductor integrated circuit, said method comprising the steps of:

deciding whether design rule check error data which are generated are indicative of a true error or a false error, depending on whether or not the design rule check error data are present in a corresponding region of said mask pattern data on said semiconductor substrate;

entering said mask pattern data;

entering said design rule check error data;

determining said design rule check error data as representing said true error if said design rule check error data are present in the corresponding region of said mask pattern data on said semiconductor substrate, and as representing said false error if said design rule check error data are not present in the corresponding region of said mask pattern data on said semiconductor substrate;

outputting said true error as a design rule check result; and failing to output said false error as a design rule check result.

4. A method of checking design rules for a semiconductor integrated circuit to determine whether or not mask pattern data of the semiconductor integrated circuit, which represent active and passive components on a surface of a semiconductor substrate, are properly designed according to design standards for the semiconductor integrated circuit, said method comprising the step of:

deciding whether design rule check error data indicate a true error or a false error based on whether or not the design rule check error data are present in a specified region on said semiconductor substrate.

5. A method of checking design rules for a semiconductor integrated circuit to determine whether or not mask pattern data of the semiconductor integrated circuit, which represent active and passive components on a surface of a semiconductor substrate, are properly designed according to design standards for the semiconductor integrated circuit, said method comprising the step of:

deciding whether design rule check error data which are generated are indicative of a true error or a false error, depending on whether or not the design rule check error data are present in a specified region on said semiconductor substrate;

entering said mask pattern data;

entering said design rule check error data;

determining said design rule check error data as representing a temporary error if said design rule check error data are not present in a corresponding region of said mask pattern data on said semiconductor substrate, and as representing said false error if said design rule check error data are present in the corresponding region of said mask pattern data on said semiconductor substrate;

determining said design rule check error data as representing said true error if said temporary error is present in said specified region, and as representing said false error if said temporary error is not present in said specified region;

outputting said true error as a design rule check result; and failing to output said false error as a design rule check result.

6. A method of checking design rules for a semiconductor integrated circuit to determine whether or not mask pattern data of the semiconductor integrated circuit, which represent active and passive components on a surface of a semiconductor substrate, are properly designed according to design standards for the semiconductor integrated circuit, said method comprising the step of:

deciding whether design rule check error data which are generated are indicative of a true error or a false error, depending on whether or not the design rule check error data are present in a specified region on said semiconductor substrate;

entering said mask pattern data;

entering said design rule check error data;

determining said design rule check error data as representing a temporary error if said design rule check error data is present in a corresponding region of said mask pattern data on said semiconductor substrate, and as representing said false error if said design rule check error data are not present in the corresponding region of said mask pattern data on said semiconductor substrate;

determining said design rule check error data as representing said true error if said temporary error is not present in said specified region;

outputting said true error as a design rule check result; and failing to output said false error as a design rule check result.

* * * * *